United States Patent
Chhabra et al.

(10) Patent No.: US 6,674,587 B2
(45) Date of Patent: Jan. 6, 2004

(54) ANTIGLARE OPTICAL DEVICE

(75) Inventors: Deep Singh Chhabra, Chandigarh (IN); Parinam Krisna Rao, Chandigarh (IN); Bipin Dev Sharma, Chandigarh (IN); Dharambir Singh Dodd, Cgabdugarg (IN); Virender Singh, Chandigarh (IN); Sanjay Sharma, Chandigarh (IN)

(73) Assignee: Council of Scientific Research, New Delhi (IN)

( * ) Notice: Subject to any disclaimer, the term of this patent is extended or adjusted under 35 U.S.C. 154(b) by 74 days.

(21) Appl. No.: 09/821,834

(22) Filed: Mar. 30, 2001

(65) Prior Publication Data

US 2003/0016460 A1 Jan. 23, 2003

(51) Int. Cl.$^7$ .................................................. G02B 5/22
(52) U.S. Cl. ................. 359/888; 359/885; 359/361; 359/601; 359/603; 359/614; 427/166; 296/97.6; 296/97.7
(58) Field of Search ................................ 359/888, 360, 359/359, 361, 589, 601, 603, 614, 885; 296/97.6, 97.7; 428/432, 689; 427/166

(56) References Cited

U.S. PATENT DOCUMENTS

| | | | | | |
|---|---|---|---|---|---|
| 2,450,853 A | * | 10/1948 | Colbert | ........................ | 427/166 |
| 2,675,740 A | * | 4/1954 | Barkley | ....................... | 428/161 |
| 3,603,672 A | * | 9/1971 | Bastide | ........................ | 359/888 |
| 4,148,939 A | * | 4/1979 | Korjukin | ..................... | 427/164 |
| 5,688,608 A | * | 11/1997 | Tsai | ............................. | 359/360 |

* cited by examiner

Primary Examiner—Thong Nguyen
Assistant Examiner—Leo Boutsikaris
(74) Attorney, Agent, or Firm—Harness, Dickey & Pierce, P.L.C.

(57) ABSTRACT

The present invention relates to a method of deposition of an absorbing material upon a plastic/glass substrate by vacuum coating at an angle of inclination between 5° to 30° and using a mask on the evaporation source to produce a graded film material and a method for the preparation of graded density absorbing film useful as an antiglare optical device for protecting the eyes by reducing the glare by absorbing the light intensity falling upon it in a non-uniform fashion.

30 Claims, 4 Drawing Sheets

ANTIGLARE OPTICAL DEVICE

FIELD OF THE INVENTION

The present invention relates to a method of deposition of an absorbing material upon a plastic/glass substrate by vacuum coating at an angle of inclination between 5° to 30° and using a mask on the evaporation source to produce a graded film material. More particularly, the present invention relates to a method for the preparation of graded density absorbing film useful as an antiglare optical device for protecting the eyes by reducing the glare by absorbing the light intensity falling upon it in a non-uniform fashion.

BACKGROUND AND PRIOR ART TO THE INVENTION

The necessity of Night driving filter was felt as in the night time It becomes very difficult to drive on the high ways due to the radiations falling on the eye of incoming vehicles on the driver's eye. The excessive radiations falling on the eye makes the eye pupil to close resulting in the darkness of the view in front of the driver and accidents occur. Also the UV and IR content of the radiations make the eyes prone to cataract and other diseases. This made it essential to have device which removes this excessive radiations.

During night driving, the headlights of the vehicles approaching in the opposite direction emit radiations in the wavelength of 320–400 nm and 750–1400 nm. These radiations blind the driver due to which a number of accidents occur in the night. The frequent blinding glare not only makes the driving difficult, but also impairs the vision. The impairment of the vision occurs due to development of cataract in the crystalline lens by the UV radiation and also retinal deterioration caused due to the thermal effects of IR radiation in the long run.

Figure 1:
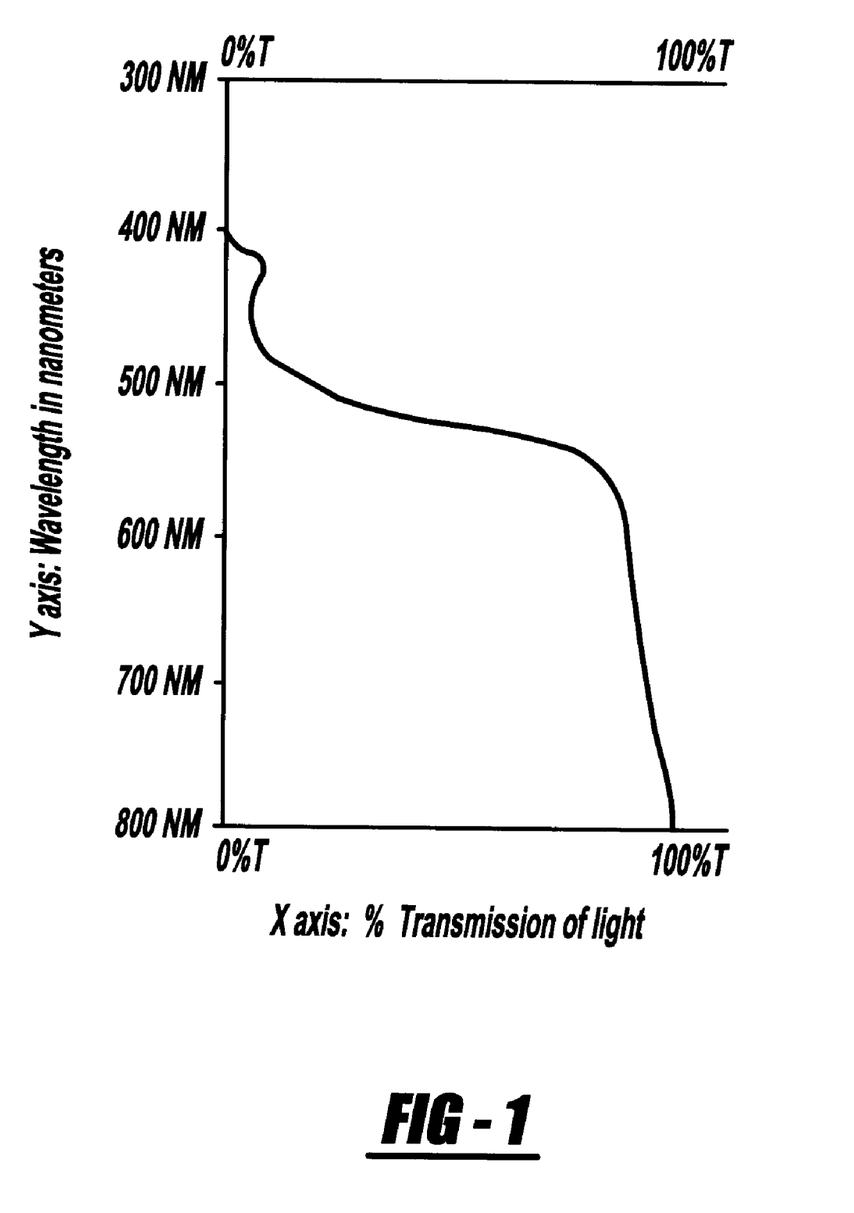
FIG. 1 represent the spectral profile of the yellow colored plastic manufactured by M/s Proview Optical Corporation, Taiwan.

To reduce the blinding effect produced by an approaching vehicle, many plastic goggles have been manufactured. A reference may be made to the night driving plastic goggles manufactured by M/s Proview Optical Corporation, Taiwan wherein yellow colored plastic is used whose spectral profile is shown in FIG. 1. The transmission table is given as Table 2. The drawbacks with these goggles as inferred from the spectral profile are as follows:

1. It reduces the transmission in the wavelength region 300–540 nm over the entire surface area thereby it also suppresses visualisation of the road on the left side.
2. It does not completely block the blinding glare entering the eyes fro the right had side of the windshield as it is transmitting more than 70% of the radiation in the wavelength region 550–750 nm.
3. Due to selective transmission in the visible region, i.e., having absorption in the blue region, it distorts the color of the objects which might effect the recognition of the person wearing blue color clothes.

Another reference may be made to St. Martin sunglasses manufactured and distributed by M/s Thukral Optics, New Delhi wherein spectacle glasses are claimed to be used as anti-radiation for filtering out UV and IR radiation from computer monitors and TV screen as well as for night driving to prevent blind spot. However, the literature of the product does not give any spectral curve or technical clarifications justifying the use of spectacle glasses for night driving.

OBJECTS OF THE INVENTION

The main object of the present invention is to provide a method for preparing a graded density absorbing film useful as an antiglare optical device.

Another object of the present invention is to provide a method for the deposition of absorbing film material upon plastic/glass substrate by vacuum coating on a inclined substrate with angel of inclination between 5° to 30° and using a mask on the evaporation source.

Still another object of the present invention is to provide a method for the preparation of an antiglare optical device for protecting the eyes of the automobile driver during night driving.

Yet another object of the present invention is to provide a method for the preparation of an antiglare device to protect the automobile drivers eye from radiation in the wavelength range 320–400 nm and 750–1400 nm.

One more object of the present invention is to prevent impairment of vision due to development of cataract in the crystalline lens by the UV radiation and also retinal deterioration caused due to the thermal effects of IR radiation in the long run.

SUMMARY OF THE INVENTION

The present invention relates to a method of deposition of an absorbing material upon a plastic/glass substrate by vacuum coating at an angle of inclination between 5° to 30° and using a mask on the evaporation source to produce a graded film material. More particularly, the present invention relates to a method for the preparation of graded density absorbing film useful as an antiglare optical device for protecting the eyes by reducing the glare by absorbing the light intensity falling upon it on a non-uniform fashion.

DETAILED DESCRIPTION OF THE INVENTION

Accordingly, the present invention provides a method of manufacturing a coated substrate to be used as but not limited to automobile anti-glare filter, said method comprising providing a transparent substrate made of glass or synthetic material, coating a gradient density absorbing film on one side of the substrate kept at an inclined position with an angle of inclination varying between 5° to 30° with respect to a evaporation source, masking the evaporation source during the deposition of the absorbing material and coating the substrate with an Anti Reflection (AR) material on both surfaces thereby obtaining the anti glare optical device.

In an embodiment of the present invention, the thickness of the first coating is determined in terms of transmission of the gradient density absorbing film.

In another embodiment of the present invention, the deposition of the first coating is done so as to obtain the following transmission data on the substrate:

| Distance from RHS | % Transmission at 550 nm |
| --- | --- |
| 50 mm | 45 to 50 |
| 100 mm | 30 to 35 |
| 200 mm | 50 to 60 |
| 300 mm | 75 to 80 |

In another embodiment of the present invention, the evaporation source is a tungsten spiral filament.

In still another embodiment of the present invention, the evaporation is done in a vacuum coating plant maintained at $2 \times 10^{-5}$ mb to $1 \times 10^{-6}$ mb.

In yet another embodiment of the present invention, the absorbing material is selected from the group comprising of Inconel, Rhodium, Palladium, Nichrome, chromium and mixtures mixtures thereof.

In one more embodiment of the present invention, the AR material is selected from the group comprising of Magnesium fluoride, Silicon dioxide and mixtures thereof.

In one another embodiment of the present invention, the synthetic material is polycarbonate plastic.

In an embodiment of the present invention, after the absorbing material is coated, the chamber is brought to normal atmospheric pressure and the coated substrate is placed horizontal w.r.t. evaporating source, the chamber is evacuated to get the same vacuum and the AR material is evaporated on both sides.

The present invention further provides a method of manufacturing an improved anti glare optical device for automobiles, said method comprising: providing a transparent substrate made of glass or synthetic material, coating a gradient density absorbing film on one side of the substrate kept at an inclined position with an angle of inclination varying between 5° to 30° with respect to a evaporation source, masking the evaporation source during the deposition of the absorbing material and coating the substrate with Anti Reflection material on both surfaces thereby obtaining the anti glare optical device.

In an embodiment of the present invention, the thickness of the first coating is determined in terms of transmission of the gradient density absorbing film.

In another embodiment of the present invention, the deposition of the first coating is done so as to obtain the following transmission data on the substrate:

| Distance from RHS | % Transmission at 550 nm |
|---|---|
| 50 mm | 45 to 50 |
| 100 mm | 30 to 35 |
| 200 mm | 50 to 60 |
| 300 mm | 75 to 80 |

In still another embodiment of the present invention, the evaporation source is a tungsten spiral filament.

In yet another embodiment of the present invention, the evaporation is done in a vacuum coating plant maintained at $2 \times 10^{-5}$ mb to $1 \times 10^{-6}$ mb.

In one more embodiment of the present invention, the absorbing material is selected from the group comprising of Inconel, Rhodium, Palladium, Nichrome, and chromium or mixtures thereof.

In one another embodiment of the present invention, the AR material is selected from the group comprising of Magnesium fluoride and Silicon dioxide.

In an embodiment of the present invention, the synthetic material is a polycarbonate plastic.

In another embodiment of the present invention, after the absorbing material is coated, the chamber is brought to normal atmospheric pressure and the coated substrate is placed horizontal w.r.t. the evaporating source, the chamber is evacuated to get the same vacuum and the AR material is evaporated on both sides.

The present invention also provides an improved coated article to be used as but not limited to automobile anti-glare filter, said article comprising a substrate made of transparent material coated at one side with a gradient density absorbing film, said gradient density absorbing film is deposited at an angle of inclination of 5° to 30° w.r.t. an evaporating source, and coated on both the sides with an AR material.

In an embodiment of the present invention, the thickness of the first coating is determined in terms of transmission of the gradient density absorbing film.

In another embodiment of the present invention, the thickness of the first coating is such that it produces the following transmission data on the substrate:

| Distance from RHS | % Transmission at 550 nm |
|---|---|
| 50 mm | 45 to 50 |
| 100 mm | 30 to 35 |
| 200 mm | 50 to 60 |
| 300 mm | 75 to 80 |

In still another embodiment of the present invention, the evaporation source is a tungsten spiral filament.

In yet another embodiment of the present invention, the evaporation is done in a vacuum coating plant maintained at $2 \times 10^{-5}$ mb to $1 \times 10^{-6}$ mb.

In one more embodiment of the present invention, the absorbing material is selected from the group comprising of Inconel, Rhodium, Palladium, Nichrome, and chromium or mixtures thereof.

In one another embodiment of the present invention, the AR material is selected from the group comprising of Magnesium fluoride and Silicon dioxide.

In an embodiment of the present invention, the synthetic material is polycarbonate plastic.

In another embodiment of the present invention, the RHS of the device seen in the direction of view of the driver blocks the blinding glare coupled with attenuation in the wavelengths regions 320–400 nm in the UV and 750–1400 nm in the IR, at the same time visualisation of the road from the center as well as LHS of the filter is not reduced.

In still another embodiment of the present invention, the said article protects the driver's eye from the radiation in the wavelength range 320–400 nm and 750–1400 nm produced by the headlights of approaching vehicles in order to prevent impairment of the vision due to development of cataract in the crystalline lens by the UV radiation and also retinal deterioration caused due to the thermal effects of IR radiation in the long run.

In yet another embodiment of the present invention the neutral transmission of the optical filter is the visible range.

In still another embodiment of the present invention, the said article does not distort the color of the object.

In yet another embodiment of the present invention, the said article is capable of being used during night driving and to be mounted in front of the driver on the automobile's wind shield, which comprises of a gradient density absorbing film deposited upon glass/plastic substrate by vacuum coating and also Anti-Reflection (AR) coating on both surfaces of the substrate, providing adjustments on the wind shield for the compensation in the drivers eye-level and also providing means to latch on to the automobile's ceiling when not is use, clearing the steering wheel and the driver's head.

In one more embodiment of the present invention, the article has the following characteristics:

a) size: 300×150×2–3 mm.
b) transmission at 550 nm: continuously varying along the length of the device.
c) transmission in wavelength regions:

320–400 nm: less than 10%
400–1400 nm: neutral; neutrality within ±10% of the value at 550 nm.

d) position of Max. and Min. transmission:

| Distance from RHS | % Transmission at 550 nm |
|---|---|
| 50 mm | 45 to 50 |
| 100 mm | 30 to 35 |
| 200 mm | 50 to 60 |
| 300 mm | 75 to 80 |

The article is mounted on the automobile's windshield in front of the driver. The device is used by the driver during night driving to protect his/her eyes from the blinding glare (excessive visible radiation) and the radiation in the wavelength region 320–400 nm in the ultraviolet (UV) as well as in the region 750–1400 nm in the infrared (IR), produced by the headlights of the approaching vehicles in order to prevent the road accidents. The frequent blinding glare not only makes the driving difficult, but also impairs the vision. The device has the provisions to be flipped on to the windshield at the driver's eye level during the night and to be latched on to the vehicle's ceiling when not in use.

BRIEF DESCRIPTION OF THE ACCOMPANYING DRAWINGS

In the drawings accompanying the specification.

The invention is described in detail in the examples given below which are provided to illustrate the invention and therefore should not be considered to limit the scope of the present invention.

EXAMPLES

Example 1

Accordingly the present invention provides an improved antiglare optical device for automobiles useful during night driving; to be mounted in front of the driver on the automobile's wind shield which comprises of a gradient density absorbing film deposited upon glass/plastic substrate by vacuum coating and also Anti-Reflection (AR) coating on both surfaces of the substrate, providing adjustments on the wind shield for the compensation in the drivers eye-level and also providing means to latch on to the automobile's ceiling when not in use, clearing the steering wheel and the driver's head.

The provisional specifications of the filter are:
  Substrate Material: Optical glass, Polycarbonate plastic.
  Size: 300×150×2–3 mm duly mounted inmechanical frame for fitment in the car.
  Coating:
    Glass Substrate: Graded absorbing film over coated with AR film on one surface and only AR film on second surface.
    Plastic Substrate: Graded absorbing film over coated with AR film on one surface and cemented with Polycarbonate plastic sheet. AR film on second surface.

Coating Materials: The commonly used materials with neutral transmission for the graded coating are Inconel, Rhodium, Palladium, Nichrome, chromium and for the AR coating Magnesium fluoride and Silicon dioxide.

These are the standard materials and their characteristics are available in all the materials catologue.

Spectral Characteristics:
  Transmission at 550 mm: Continuously varying along the length of the filter.
  Position of Max. and Min. transmission:

| Distance from RHS | % Transmission at 550 nm |
|---|---|
| 50 mm | 40 |
| 100 mm | 35 |
| 300 mm | 75 |

Transmission in wavelength regions:
  320–400 nm: Less than 10%
  400–1400 nm: Neutral; neutrality within ±10% of the value at 550 nm

Example 2

Computation of Thickness Gradation

The film gradation is designed by taking into consideration the luminance distribution of light on the wind shield from the approaching vehicle, distance between the two vehicles and the distance of the filter from the center of rotation of the eyc. In this connection, the necessary data has been generated by conducting the requisite experiments. From this data of luminance distribution the thickness gradation of the film in terms of transmission is found for getting gradient density absorbing film. The required gradation profile is given in FIG. 3.

Example 3

Experimental Methods

Figure 3:
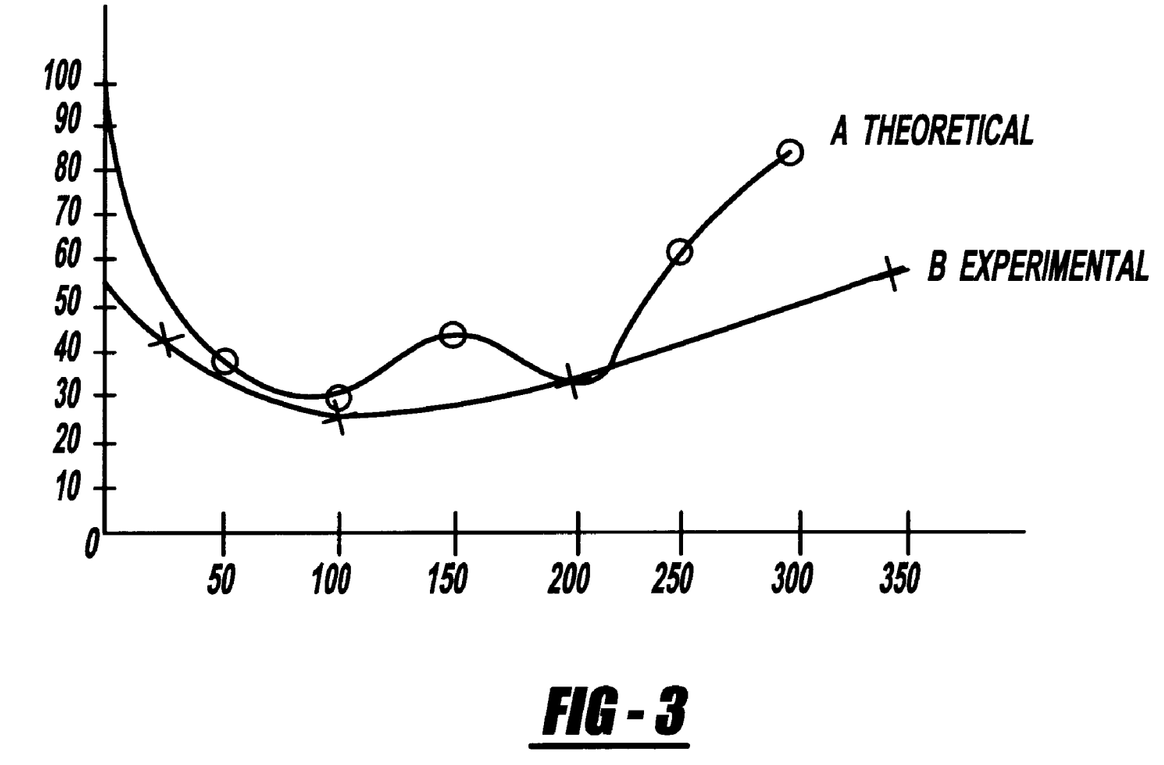
FIG. 3 represents the gradation profile of the present device.

The glass/plastic substrate after proper cleaning ins placed inside the chamber of a vacuum coating plant in an inclined position with respect to evaporation source. The angle of inclination varies from 5° to 30°. Tungsten spiral filament is used as the source for the evaporation of absorbing material and a mask is suitably positioned above the filament; the chamber is then evacuated to a high vacuum. After achieving the vacuum better than $2\times10^{-5}$ mb, the material is evaporated by passing the current in the filament to obtain the graded absorbing film on the substrate. Afterwards, AR film is deposited on both surfaces by suitably placing the substrate in the chamber. FIG. 3 depicts the gradation profile of the experimental coating without having AR coating on both surfaces. The data for the profile was obtained by measuring the transmission at 550 nm on various locations of the filter. It can be seen from the figure that at a distance of 100 mm from RHS, the absorbance is highest because it is at this point the intensity of light (Glare) is maximum therefore it gets absorbed to the maximum extent and is not felt by the driver.

Figure 2:
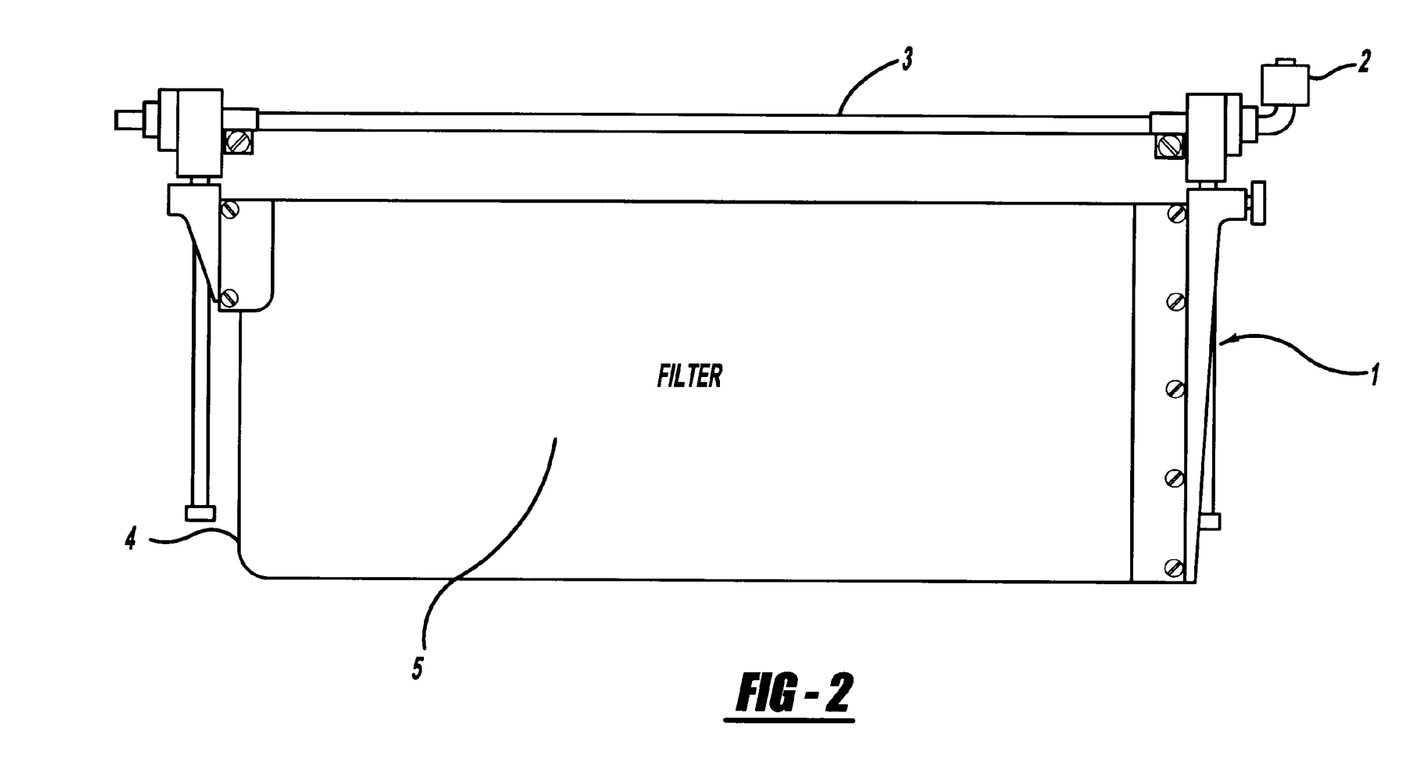
FIG. 2 represents the antiglare optical device of the present invention.

The coated substrate is assembled in the adjustable mechanical mount as shown in FIG. 2, and then fitted in the car. The mount has the mechanism to flip the filter in and out of driver's field of view on the windshield. FIG. 2 clearly shows the various means and parts of the anti-glare device capable of being fitted into an automobile. The anti-glare device (1) can be attached with the front roof or any suitable structure falling in the front field of view of the driver by a suitable connecting means (2). This connecting means could be a nut and bolt arrangement. A rod (3) capable of being rotated in the horizontal plane is attached with the connecting means (2). Both edges of the rod (3) have means for fixing anti reflective panel (4). The fixing means are capable of rotating the panel in the vertical plane, as well as providing up and down movement to the panel. The panel is coated with anti reflective material, which acts as a filter (5).

Figure 4:
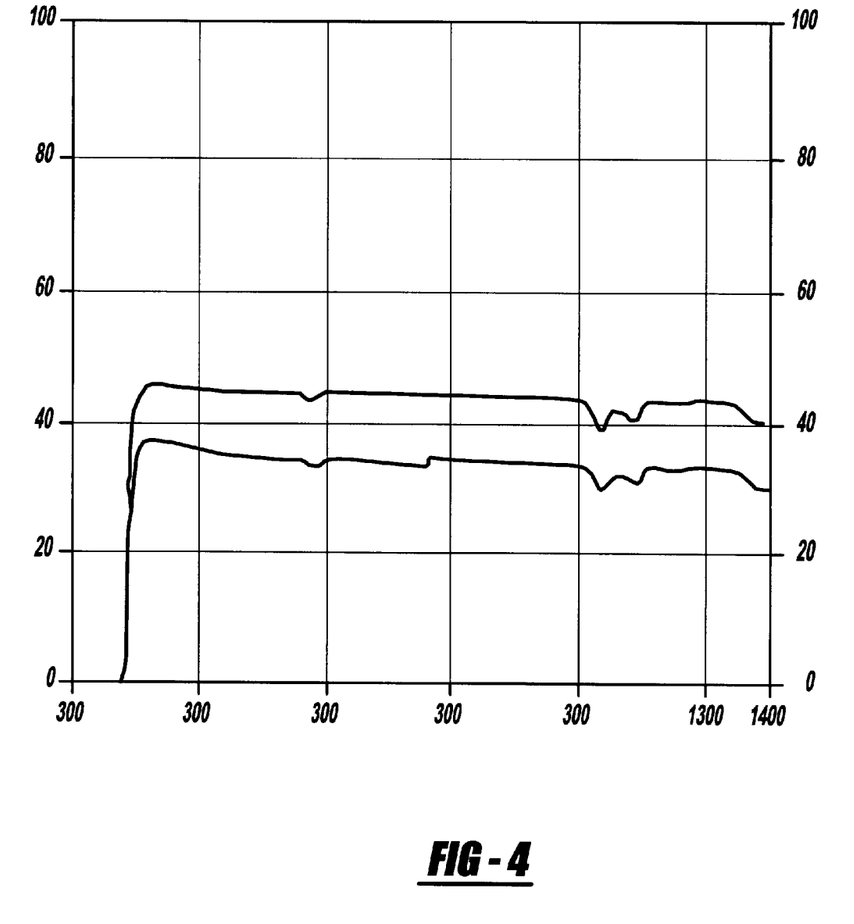
FIG. 4 represents the spectral transmission profile of the present device.

Thickness of the coating is determined in terms of transmission of the gradient density absorbing coating. Reference may be made to FIG. 4 where the variation in transmission is shown as 35 to 75%.

The transmission of the coating during deposition is controlled in such a way that the following transmission data is obtained on the substrate:

| Distance from RHS | % Transmission at 550 nm |
|---|---|
| 50 mm | 45 to 50 |
| 100 mm | 30 to 35 |
| 200 mm | 50 to 60 |
| 300 mm | 75 to 80 |

Example 4

Environmental and Other Tests Done on the Filter

1. Hardness Test:

This was done by using the coating Hardness tester of summer laboratories, USA as per standard no. Mil -C-675 A where it is mentioned that no scratch should be visible after subjecting the coated sample to 20 complete strokes of 1" length with a rubber eraser conforming to MIL -E- 12397 under a force of 2:5 pounds. The coated sample has passed the test as no scratches appeared.

2. Adhesion Test:

The coated sample has passed the test as no peel-off is seen. The coated component was subjected to an adhesion test as per MIL standard no. MIL-F-48616. In this test ½" wide cellophane tape conforming to type I of L-T-90 is used. The adhesive tape is pressed so as to cover the coated surface and then quickly removed at an angle normal to the coated surface. After removal of the tape the coated surface is examined for any peel-off.

3. Climatic & Environmental Tests:

a) Heat Test: The coated sample was kept in an environment of 65° C. temperature for three hours.

b) Heat & Humidity Test: The samples were kept in an environment of 40° C. and 95% RH for 3 cycles of 24 hours duration.

c) Salt spray Test: The samples were subjected to a spray of salt mixture for 2 hours and then kept in the same environment for 24 hours.

After the above mentioned environmental tests, the samples were evaluated by visual examination, adhesion, hardness and spectral transmission.

No damage was observed in the visual examination and it has passed the Hardness, Adhesion tests.

Spectral transmission was measured on the Perkin-Elmer spectrophotometer. It is observed that there was no appreciable variation of T% of the samples.

Preliminary user's trials have been conducted by mounting the improvised device on the windshield of the ambassador car and driving on the city roads (single & dual carriage-way) and on the highways in the night which have yielded encouraging response. Reference may be made to Table 1 for the online performance trials. Further work to fabricate the complete device, technical and user's trials and also on plastic substrates are being carried out.

TABLE 1

Online Performance Trial Reports

| Date/Distance | Distance Covered (Km) | One/Two way Traffic (Km) | Unlighted Road (Km) | Speed (Km/hr) | Driver/Age | Observations |
|---|---|---|---|---|---|---|
| 22/9/2000 7.00 to 7.30 pm | 25 | 6/19 | 2 | 30–50 | Amar Chand 58 | Glare reduced significantly, overall view little bit dark |
| 26/9/2000 6.30 to 7.30 pm | 40 | 10/30 | 10 | 30–50 | Dilbagh Singh 38 | Glare reduced significantly, overall view little bit dark |
| 27/9/2000 | 40 | 25/15 | 25 | 30–70 | Amrik Singh 37 | No glare, overall view good. |

TABLE 2

Transmission values of the night driving plastic goggles manufactured by M/s Proview Optical Corporation, Taiwan.

| Wavelength | Transmission Values | Wavelength | Transmission Values |
|---|---|---|---|
| 300 | 0.0 | 310 | 0.0 |
| 320 | 0.0 | 330 | 0.0 |
| 340 | 0.0 | 350 | 0.0 |
| 360 | 0.0 | 370 | 0.0 |
| 380 | 0.0 | 390 | 0.0 |
| 400 | 0.0 | 410 | 2.2 |
| 420 | 6.8 | 430 | 6.8 |
| 440 | 5.4 | 450 | 5.1 |
| 460 | 5.5 | 470 | 5.7 |
| 480 | 7.1 | 490 | 11.1 |
| 500 | 16.2 | 510 | 21.2 |
| 520 | 29.5 | 530 | 44.0 |
| 540 | 59.8 | 550 | 70.0 |
| 560 | 75.0 | 570 | 77.3 |
| 580 | 78.4 | 590 | 79.2 |

TABLE 2-continued

Transmission values of the night driving plastic goggles
manufactured by M/s Proview Optical Corporation, Taiwan.

| Wavelength | Transmission Values | Wavelength | Transmission Values |
|---|---|---|---|
| 600 | 79.8 | 610 | 80.5 |
| 620 | 81.1 | 630 | 81.4 |
| 640 | 81.6 | 650 | 81.9 |
| 660 | 82.2 | 670 | 82.7 |
| 680 | 83.2 | 690 | 83.6 |
| 700 | 83.9 | 710 | 84.5 |
| 720 | 85.1 | 730 | 85.4 |
| 740 | 86.2 | 750 | 87.2 |
| 760 | 87.6 | 770 | 88.4 |
| 780 | 88.7 | | |

The main advantages of the present invention are:
1. The RHS of the device seen in the direction of view of the driver blocks the blinding glare coupled with attenuation in the wavelength regions 320–400 nm in the UV and 750–1400 nm in the IR, at the same time visualisation of the road from the center as well as LHS of the filter is not reduced.
2. It protects the driver's eye from the radiation in the wavelength range 320–400 nm and 750–1400 nm produced by the headlights of approaching vehicles in order to prevent impairment of the vision due to development of cataract in the crystalline lens by the UV radiation and also retinal deterioration caused due to the thermal effects of IR radiation in the long run.
3. The neutral transmission of the optical filter in the visible range (FIG. 4) does not distort the color of the object.

What is claimed is:

1. A method of manufacturing a coated substrate to be used as TV screen filter, UV filter of automobile anti-glare filter, said method comprising providing a transparent substrate made of glass or synthetic material having a first and a second surface, coating a gradient density absorbing film on the first surface of the substrate, kept at an inclined position with an angle of inclination varying between 5° to 30° with respect to an evaporation source so as to obtain the following transmission data on the substrate:

| Distance from Right Hand Side edge of the substrate | % Transmission at 550 nm |
|---|---|
| 50 mm | 45 to 50 |
| 100 mm | 30 to 35 |
| 200 mm | 50 to 60 |
| 300 mm | 75 to 80 | masking the evaporation source during the deposition of the absorbing film and coating with one or more Anti Reflection (AR) materials on the first and the second surface of the substrate thereby obtaining the anti glare optical device.

2. A method as claimed in claim 1, wherein the thickness of coating of the absorbing film on the first surface is determined in terms of transmission of gradient density of the absorbing film.

3. A method as claimed in claim 1, wherein the evaporation source is a tungsten spiral filament.

4. A method as claimed in claim 1, wherein the evaporation is done in a vacuum coating plant maintained at $2 \times 10^{-5}$ mb to $1 \times 10^{-6}$ mb.

5. A method as claimed in claim 1, wherein the absorbing material is selected from the group consisting of Inconel, Rhodium, Palladium, Nichrome, and chromium or mixtures thereof.

6. A method as claimed in claim 1, wherein the AR material is selected from the group consisting of Magnesium fluoride and Silicon dioxide.

7. A method as claimed in claim 1, wherein the synthetic material is polycarbonate plastic.

8. A method as claimed in claim 1, wherein after the absorbing material is coated, the vacuum coating plant is brought to normal atmospheric pressure and the coated substrate is placed horizontal w.r.t. the evaporating source, the vacuum coating plant is evacuated to maintain $2 \times 10^{-5}$ mb to $1 \times 10^{-6}$ mb and the AR material is evaporated on the first and the second surface of the substrate.

9. A method of manufacturing an improved anti glare optical device for automobiles, said method comprising: providing a transparent substrate made of glass or synthetic material having a first and a second surface, coating a gradient density absorbing film on the first surface of the substrate kept at an inclined position with an angle of inclination varying between 5° to 30° with respect to an evaporation source so as to obtain the following transmission data on the substrate:

| Distance from Right Hand Side edge of the substrate | % Transmission at 550 nm |
|---|---|
| 50 mm | 45 to 50 |
| 100 mm | 30 to 35 |
| 200 mm | 50 to 60 |
| 300 mm | 75 to 80 | masking the evaporation source during the deposition of the absorbing film and coating one or more Anti Reflection (AR) materials on the first and the second surface of the substrate thereby obtaining the anti glare optical device.

10. A method as claimed in claim 9, wherein the thickness of the coating of the absorbing film on the first surface is determined in terms of transmission of the gradient density of the absorbing film.

11. A method as claimed in claim 9, wherein the evaporation source is a tungsten spiral filament.

12. A method as claimed in claim 9, wherein the evaporation is done in a vacuum coating plant maintained at $2 \times 10^5$ mb to $1 \times 10^{-6}$ mb.

13. A method as claimed in claim 9, wherein the absorbing material is selected from the group consisting of Inconel, Rhodium, Palladium, Nichrome, and chromium or mixtures thereof.

14. A method as claimed in claim 9, wherein the AR material is selected from the group consisting of Magnesium fluoride and Silicon dioxide.

15. A method as claimed in claim 9, wherein the synthetic material is polycarbonate plastic.

16. A method as claimed in claim 9, wherein after the absorbing material is coated, the vacuum coating plant is brought to normal atmospheric pressure and the coated substrate is placed horizontal w.r.t. the evaporating source, the vacuum coating plant is evacuated to maintain $2 \times 10^{-5}$ mb to $1 \times 10^{-6}$ mb and the AR material is evaporated on the first and the second surface of the substrate.

17. An improved coated article to be used as TV screen filter, UV filter or automobile anti-glare filter, said article comprising a substrate made of transparent material having a first and a second surface, said transparent material being coated with a gradient density absorbing film on the first surface such that it produces the following transmission data on the substrate:

| Distance from Right Hand Side edge of the substrate | % Transmission at 550 nm |
|---|---|
| 50 mm | 45 to 50 |
| 100 mm | 30 to 35 |
| 200 mm | 50 to 60 |
| 300 mm | 75 to 80 | said gradient absorbing film being deposited at an angle of inclination of 5° to 30° w.r.t an evaporating source and said substrate being coated with an Anti Reflection Material on the first and the second surface.

18. An article as claimed in claim 17, wherein the thickness of coating of the absorbing film on the first surface is determined in terms of transmission of gradient density of the absorbing film.

19. An article as claimed in claim 17, wherein the article transmits less than 10% in the wavelength region of 320 to 400 nm, and neutrality within ±10% of the value at 550 nm in the wave length region of 400 to 1400 nm.

20. An article as claimed in claim 17, wherein the evaporation source is a tungsten spiral filament.

21. An article is claimed in claim 17, wherein the evaporation is performed in an vacuum coating plant maintained at $2 \times 10^{-5}$ mb to $1 \times 10^{-6}$ mb.

22. An article as claimed in claim 17, wherein the absorbing material is selected from the group consisting of Inconel, Rhodium, Palladium, Nichrome, and chromium or mixtures thereof.

23. An article as claimed in claim 17, wherein the AR material is selected from the group consisting of Magnesium fluoride and Silicon dioxide.

24. An article as claimed in claim 17, wherein the transparent material is polycarbonate plastic.

25. An article as claimed in claim 17, wherein the RHS of the article seen in the direction of view of the driver blocks the blinding glare coupled with attenuation in the wavelength regions 320–400 nm in the UV and 750–1400 nm in the IR, at the same time, visualization of the road from the center as well as left hand side of the substrate is not reduced.

26. An article as claimed in claim 17, wherein the said article protects the driver's eye from the radiation in the wavelength range 320–400 nm and 750–1400 nm produced by the headlights of approaching vehicles in order to prevent impairment of the vision due to development of cataract in the crystalline lens by the UV radiation and also retinal deterioration caused due to the thermal effects of IR radiation in the long run.

27. An article as claimed in claim 17, wherein the neutral transmission of the optical filter in the visible range.

28. An article as claimed in claim 17, wherein the said article does not distort the color of the object.

29. An article as claimed in claim 17, wherein the said article is used during night driving and is mounted in front of the driver on the automobile's wind shield, which comprises of a gradient density absorbing film deposited upon glass/plastic substrate by vacuum coating and also Anti-Reflection (AR) coating on both surface of the substrate, having means for adjusting the article on the wind shield for the compensation in the drivers eye-level and also providing means to latch on to the automobile's ceiling when not in use, clearing the steering wheel and the driver's head.

30. An article as claimed in claim 17, wherein the said article has the following characteristics:

a) size: 300×150×2–3 mm.

b) transmission at 550 nm: Continuously varying along the length of the device.

c) transmission in wavelength regions:
320–400 nm: Less than 10%
400–1400 nm: Neutral; within ±10% of the value at 550 nm.

d) position of Max. and Min. transmission:

| Distance from Right Hand Side edge of the substrate | % Transmission at 550 nm |
|---|---|
| 50 mm | 40 |
| 100 mm | 35 |
| 300 mm | 75 |

* * * * *